US006531786B1

(12) United States Patent
Yahiro

(10) Patent No.: US 6,531,786 B1
(45) Date of Patent: Mar. 11, 2003

(54) DURABLE REFERENCE MARKS FOR USE IN CHARGED-PARTICLE-BEAM (CPB) MICROLITHOGRAPHY, AND CPB MICROLITHOGRAPHY APPARATUS AND METHODS COMPRISING SAME

(75) Inventor: Takehisa Yahiro, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/585,686

(22) Filed: Jun. 1, 2000

(30) Foreign Application Priority Data

Jun. 2, 1999 (JP) .......................................... 11-155515

(51) Int. Cl.[7] .......................................... H01L 23/544
(52) U.S. Cl. ....................................... 257/797
(58) Field of Search ........................................ 257/797

(56) References Cited

U.S. PATENT DOCUMENTS 4,642,672 A * 2/1987 Kitakata ..................... 257/797

FOREIGN PATENT DOCUMENTS

| JP | 2000-252204 | 9/2000 |
| JP | 2000-348997 | 12/2000 |

\* cited by examiner

Primary Examiner—Gene M. Munson
(74) Attorney, Agent, or Firm—Klarquist Sparkman LLP

(57) ABSTRACT

Highly durable reference marks are disclosed as used, in charged-particle-beam microlithography, for performing accurate beam-position sensing and alignment. An exemplary reference mark comprises a mark substrate made of a low-thermal-expansion material, on which is formed a pattern of mark elements for receiving an incident charged particle beam. In the vicinity of the pattern, between the mark elements and the substrate, is a layer of an electrically conductive material connected to electrical ground. The conductive material has a thickness sufficient to block penetration through the layer of conductive material of incident charged particles. Charged particles absorbed by the layer are shunted to ground.

6 Claims, 3 Drawing Sheets

DURABLE REFERENCE MARKS FOR USE IN CHARGED-PARTICLE-BEAM (CPB) MICROLITHOGRAPHY, AND CPB MICROLITHOGRAPHY APPARATUS AND METHODS COMPRISING SAME

FIELD OF THE INVENTION

This invention pertains to microlithography (projection-exposure) of a pattern, defined on a reticle, onto a substrate using a charged particle beam as an energy beam. Microlithography is a key technology used in the manufacture of semiconductor integrated circuits, displays, and the like. More specifically, the invention pertains to alignment marks and reference marks, used for high-accuracy positioning of the reticle and substrate, that are irradiated by a charged particle beam, and to microlithography apparatus utilizing such marks.

BACKGROUND OF THE INVENTION

In charged-particle-beam (CPB) microlithography systems, a reticle (also termed a mask) defines a particular pattern to be projection-transferred to a suitable substrate (e.g., semiconductor wafer). Normally, the reticle is mounted to a reticle stage, and the substrate is mounted to a substrate stage. To ensure accurate pattern transfer, "marks" are situated on the reticle and/or reticle stage as well as on the substrate and/or substrate stage for use as positional as well as other adjustment references.

For example, reference marks usually are provided on the substrate stage for beam-adjustment purposes. Representative beam adjustments include adjustments to image focus, image demagnification, and image rotation. Other uses for such marks include calibration (e.g., measurement of correction values) and baseline checks (in which the position of the optical axis of the microlithography system is checked against the optical axis of the alignment optics).

A schematic elevational section of a conventional reference mark 15' is shown in FIG. 3. The reference mark 15' includes a reference-mark substrate 45 made of ZERO-DUR® (manufactured by Schott, Germany). A mark pattern is formed on the surface of the mark substrate, of which mark pattern a single mark element 43 is shown. The mark elements 43 are made of a "heavy" metal such as Ta or W. The mark elements 43 and remaining portions of the mark substrate 45 are coated with a layer 41 of a "light" metal such as Cr. Relatively thick mark elements 43 provide high-contrast of a projected image of the mark 15'. However, because the reference mark 15' comprises extremely fine (i.e., very narrow) mark elements, the maximum practical thickness of the mark elements is approximately 1 μm. Furthermore, based on various factors (backscattered-electron contrast, thermal expansion of the metal films, ease of manufacturing, etc.), the layer 41 of light metal usually has a thickness of approximately 0.1 μm. (The items denoted with the reference numeral "47" are charged particles trapped in the mark substrate 45.)

Unfortunately, the conventional reference-mark structure summarized above can be damaged by a highly accelerated beam of charged particles passing through the light-metal layer 41 into the mark substrate 45. That is, most low-thermal-expansion materials have a high electrical resistance. Whenever an incident highly-accelerated charged particle passes through the light-metal layer 41 and heavy-metal mark feature 43 and penetrates into the low-thermal-expansion material of the mark substrate 45, electrostatic-charging and discharging events occur that damage the mark substrate 45 and surficial features thereon.

It is important that reference marks remain in a stable, usable condition for a long period of time. Hence, surface damage of reference marks is a serious problem.

SUMMARY OF THE INVENTION

In view of the shortcomings of the prior art as summarized above, an object of the present invention is to provide highly durable reference marks suitable for accurate mark-position sensing. Another object is to provide charged-particle-beam (CPB) microlithography apparatus that include such reference marks and that are capable of projection-transferring extremely fine patterns very accurately.

According to a first aspect of the invention, reference marks are provided for use in charged-particle-beam microlithography. An embodiment of such a mark comprises a substrate made of a low-thermal-expansion material. A layer of an electrically conductive material is situated on the surface of the substrate. The layer is connected to electrical ground and has a thickness sufficient to prevent penetration of incident charged particles through the layer to the substrate. At least one reference-mark element is situated on the surface of the layer. The reference-mark element is formed of a material that emits backscattered electrons when irradiated by incident charged particles.

Desirably, the substrate is made of a glass ceramic material such as ZERODUR, described above. Desirably, the conductive layer is made of a light metal having a thickness ranging from 2 to 20 micrometers. Further desirably, the material that emits backscattered electrons is a heavy metal.

In an especially advantageous configuration, multiple reference-mark elements are arranged into a line-and-space pattern.

In a CPB microlithography apparatus according to the invention, the reference mark can be located on a substrate stage or on a microlithographic substrate mounted on the substrate stage.

The invention also encompasses semiconductor-fabrication processes utilizing CPB microlithography apparatus according to the invention, and semiconductor devices made according to the processes.

The foregoing and additional advantages of the invention will be more readily apparent from the following detailed description, which proceeds with reference to the accompanying drawings.

DETAILED DESCRIPTION

The following description is set forth in the context of using an electron beam as a representative charged particle beam. However, it will be understood that the general principles discussed below are readily applicable to the use of other types of charged particle beams, such as a focused ion beam.

Figure 2:
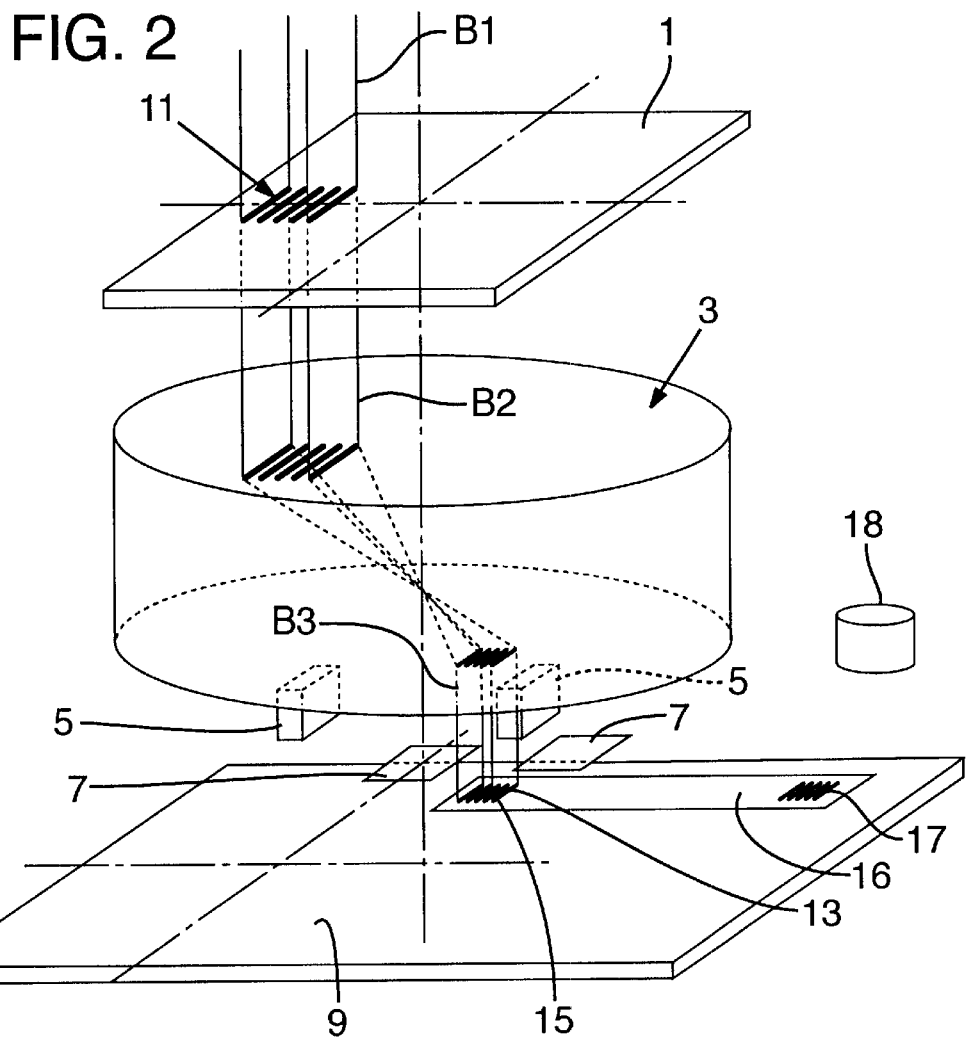
FIG. 2 is a dimetric view of certain aspects of a representative embodiment of a charged-particle-beam (CPB) microlithography apparatus according to the invention.
Figure 3:
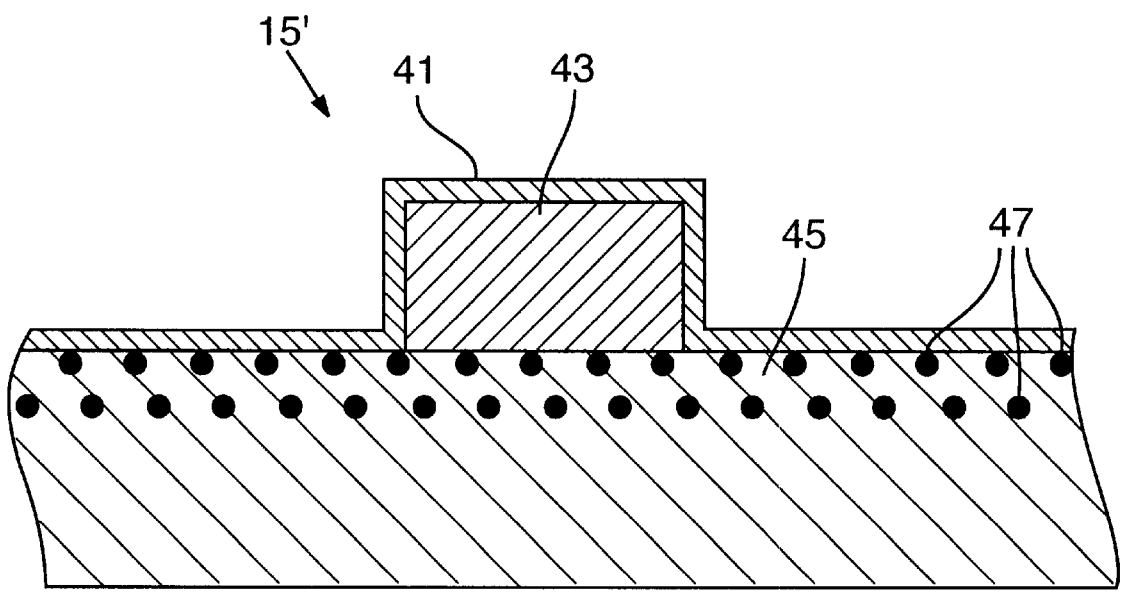
FIG. 3 is an elevational section of a conventional reference mark as used in CPB microlithography.

A representative embodiment of an electron-beam microlithography apparatus according to the invention is shown (in dimetric perspective) in FIG. 2. A reticle stage 1 receives an "illumination beam" B1 (in this example an electron beam) that is emitted in a downward (in the drawing) direction from an upstream illumination-optical system (not shown). Formed on the reticle stage 1 is a beam-shaping pattern (index mark) 11 comprising, e.g., multiple slit-shaped mark elements. Usually, the mark elements are defined by corresponding voids in the reticle stage 1 or in a reticle mounted to the reticle stage 1. As the illumination beam B1 passes through the index mark 11, the illumination beam B1 becomes a "patterned beam" B2.

Situated downstream of the reticle stage 1 is a projection-optical system 3. The projection-optical system normally comprises multiple components (not detailed) such as electromagnetic lenses, dynamic focus coil, stigmator, and magnification/rotation adjustment coil. As the patterned beam B2 passes through the projection-optical system 3, the patterned beam B2 is inverted and demagnified by the projection-optical system 3 to form an "imaging beam" B3. The imaging beam B3 is incident, as an image of the index mark, on a substrate stage 9 or on a microlithographic substrate 16 mounted to the substrate stage 9.

A deflector 5 is situated downstream of the projection-optical system 3 in this embodiment. The deflector 5 deflects the imaging beam B3 electrostatically or electromagnetically to cause the imaging beam B3 to be incident on a prescribed location on the substrate stage 9 (or microlithographic substrate 16) and form an image of the index mark 11. The image of the index mark 11 formed in this manner is termed herein the "index-mark image" 13. The wafer stage 9 (or microlithographic substrate 16) also defines a reference (fiducial) mark 15.

Situated upstream of the substrate stage 9 is a backscattered-electron (BSE) detector 7 for detecting backscattered electrons produced whenever the imaging beam B3 strikes the reference mark 15. A signal produced by the BSE detector includes data regarding the relative positional relationship of the index-mark image 13 to the reference mark 15. The signal is processed to allow a determination of the actual positional relationship of these marks.

The microlithographic substrate 16, on which the reference mark 15 can be formed, extends to the left and right in FIG. 2, and includes an "optical" mark 17 near the right-hand end of the microlithographic substrate 16. The optical mark 17 is used for performing baseline checks of substrate position by optical means. The FIG. -2 apparatus also includes an optical-mark sensor 18 that is used to detect the position of the optical mark 17. A "baseline check" is performed by sensing the position of the reference mark 15 using the electron beam, and optically sensing the position of the optical mark 17 using the optical-mark sensor 18. Hence, a measurement is obtained of the positional relationship between the electron-beam propagation axis and the axis of the optical-alignment system. Because the distance between the marks 15 and 17 is relatively long (i.e., about the length of the microlithographic substrate 16), it is imperative that the microlithographic substrate 16 have low thermal expansion to allow baseline checks to be performed with little error.

FIG. 2 also illustrates aspects of a beam-adjustment procedure, for a CPB microlithography apparatus, performed using a line-and-space reference mark 15. In this procedure, a reference mark 15 having a line-and-space pattern is scanned by a charged particle beam that has been shaped, by passage through the index mark 11, into a line-and-space pattern (i.e., the index-mark image 13) corresponding to the line-and-space pattern of the reference mark 15. By measuring the offset of the index-mark image 13 from the reference mark 15, measurements are obtained of the displacement of the actual beam position from a design-specified target beam position. After obtaining such a measurement, the beam position can be adjusted accordingly (e.g., for calibration, baseline checks, etc.)

Figure 1:
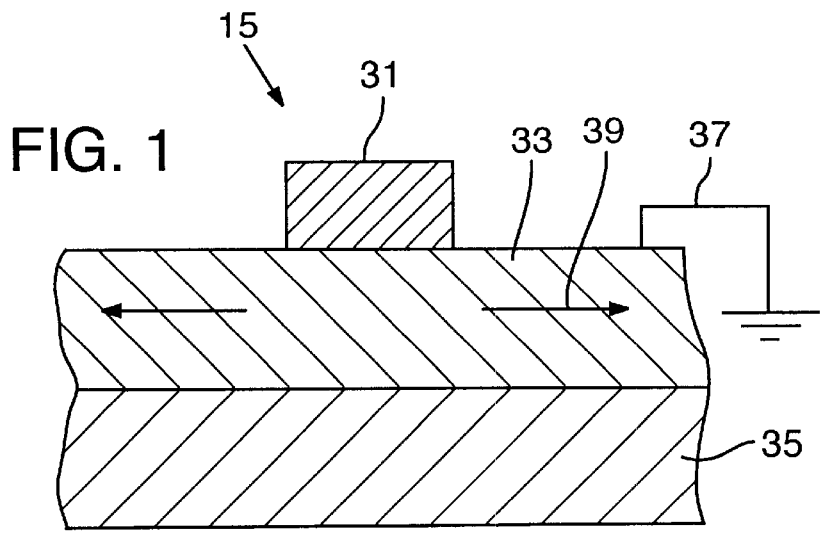
FIG. 1 is an elevational section of a representative embodiment of a reference mark according to the present invention.

A representative embodiment of a reference mark 15 according to the invention is shown (in elevational section) in FIG. 1. The reference mark 15 of the FIG. 1 embodiment comprises a substrate 35 made of Schott ZERODUR®, or other suitable low-thermal-expansion material. As used herein, a "low" coefficient of thermal expansion is 0.05 ppm/K or less, preferably less. For example, the coefficient of thermal expansion of ZERODUR® is 0.02 ppm/K, compared to 2.4 ppm/K for silicon. Formed on the substrate 35 is a layer of an electrically conductive material (desirably of a "light" metal 33 such as Cr. Other candidate light metals are Al and Ti. The maximal atomic number of a "light" metal is 52, for Cr.) The conductive layer 33 need not cover the entire substrate; it is sufficient if the conductive layer 33 be at least in the vicinity of the reference mark. Formed on the layer 33 is a pattern of mark elements 31 (only one element 31 is shown) that actually define the reference mark. The mark elements 31 are made of a material (desirably of a "heavy" metal such as Ta or W) that produces backscattered electrons when irradiated by an incident charged particle beam. (Other candidate heavy metals are Pt and Au. The minimum atomic number of a "heavy" metal is 181, for Ta.) The conductive layer 33 is connected to electrical ground 37.

To form the conductive layer 33, a layer of the electrically conductive material (desirably a "light" metal such as chromium) simply is applied to the substrate 35. The conductive layer 33 has a thickness sufficient to block incident highly accelerated charged particles from penetrating the layer 33 into the substrate 35. By way of example, the conductive layer 33 is a light metal having a thickness ranging from several micrometers to several tens of micrometers (e.g. 20 micrometers). Incident charged particles absorbed by the conductive layer 33 are shunted (arrows 39) to the electrical ground 37. Thus, the charged particles are prevented from penetrating into the substrate 35 where the particles otherwise would produce electrostatic charging/discharging that could damage the substrate 35. As a result, the reference mark 15 remains stable for extended periods of time, for use in performing highly accurate measurements and adjustments of beam position.

Figure 4:
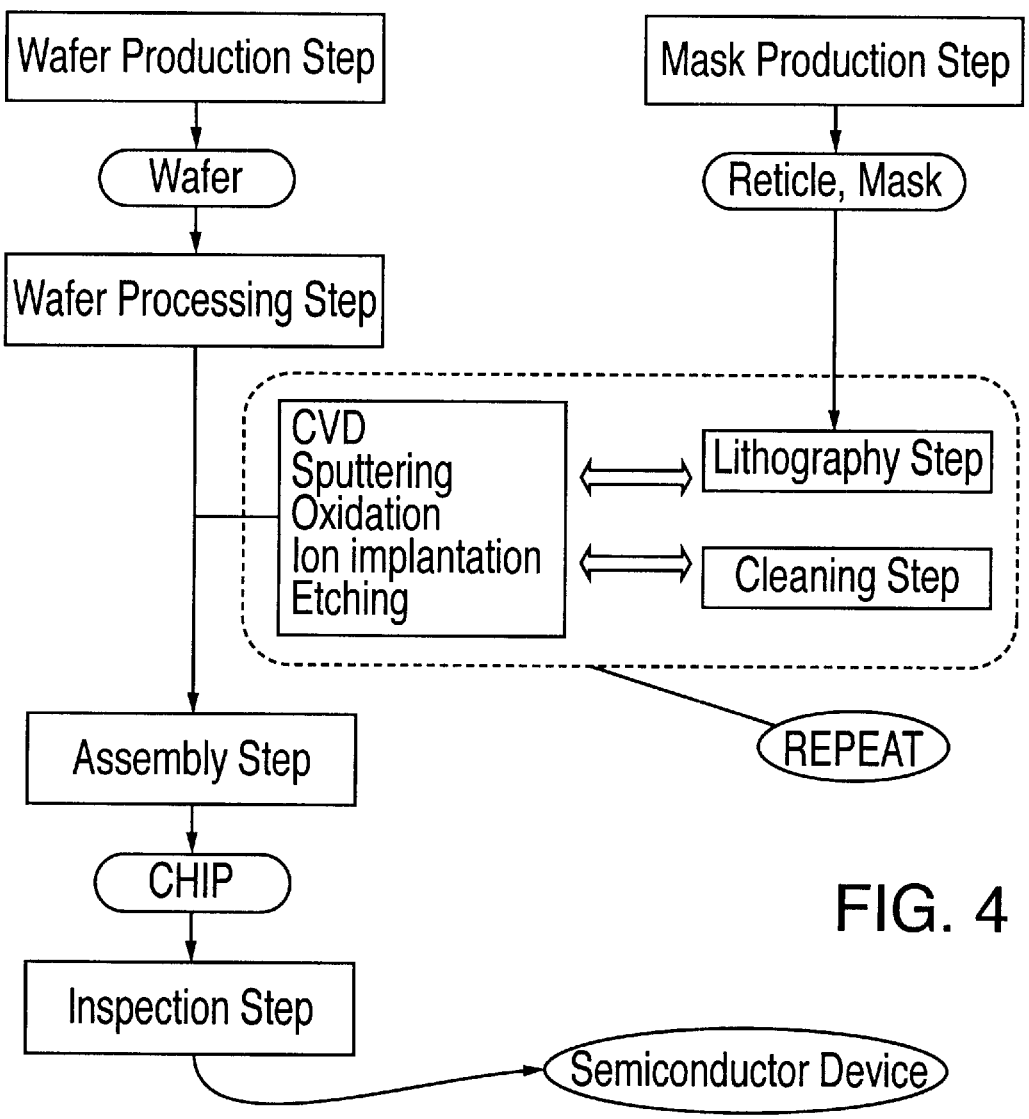
FIG. 4 is a process flowchart for manufacturing a semiconductor device, wherein the process includes a microlithography method according to the invention.

FIG. 4 is a flowchart of an exemplary semiconductor fabrication method to which apparatus and methods according to the invention can be readily applied. The fabrication method generally comprises the main steps of wafer production (wafer preparation), reticle production (reticle preparation), wafer processing (including microlithography and etching steps), device assembly (including wafer dicing, making the resulting devices operational, and packaging the devices), and inspection of finished devices. Each step usually comprises several sub-steps.

Among the main steps, wafer processing is key to achieving desired characteristics of device feature size and performance. In the wafer-processing step, multiple circuit patterns are successively layered atop one another on the wafer, wherein the formation of each layer typically involves multiple sub-steps. Usually, many layers are formed, and many operative semiconductor devices are produced on each wafer.

Typical wafer-processing steps include: (1) thin-film formation involving formation of a dielectric layer for electrical insulation or a metal layer for connecting wires; (2) surface oxidation; (3) microlithography to form a resist pattern for selective processing of the thin film or the substrate itself; (4) etching or analogous step to "micromachine" the thin film or substrate according to the resist pattern; (5) doping (impurity diffusion) or implantation as required to implant ions or impurities into the thin film or substrate according to the resist pattern; (6) resist stripping to remove the resist from the wafer; and (7) wafer inspection. Wafer processing is repeated as required (typically many times) to fabricate the desired semiconductor chips on the wafer.

Figure 5:
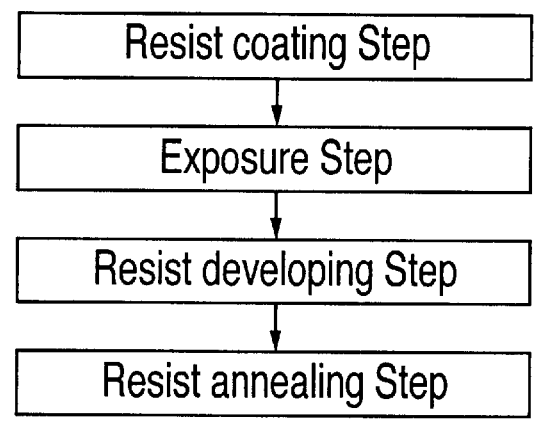
FIG. 5 is a process flowchart for performing a microlithography method that includes a projection-exposure method according to the invention.

FIG. 5 provides a flow chart of typical steps performed in microlithography. Microlithography typically includes: (1) a resist-coating step, wherein a suitable resist is coated on the wafer substrate (which can include circuit elements formed in a previous wafer-processing step); (2) an exposure step, to expose the resist with the desired pattern; (3) a development step, to develop the exposed resist; and (4) an optional annealing step, to stabilize or enhance the durability of the developed resist pattern.

Use of a microlithography apparatus according to the invention in the exposure step yields a substantial improvement in accuracy of pattern transfer in the microlithography step. It is in the microlithography step, in particular, in which the minimum linewidth and overlay-registration accuracy required to support the desired linewidth are realized. Also, in the exposure step (including position-alignment control) within the microlithography step, the present invention facilitates the manufacture of semiconductor devices that to date have been very difficult to manufacture.

As is clear from the foregoing, the present invention prevents damage to a CPB-microlithography reference mark. To such end, the reference mark is formed on a substrate having a low coefficient of thermal expansion. The reference mark can remain in a stable, usable condition for an extended period of time. This allows highly accurate and efficient beam adjustments to be made; microlithographic exposures to be made at high resolution, precision, throughput, and stability over a long period.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A reference mark for use in charged-particle-beam microlithography, comprising:
   a substrate made of a low-thermal-expansion material, the substrate having a surface;
   a layer of an electrically conductive material situated on the surface of the substrate, the conductive layer being connected to electrical ground and being made of a light metal having a thickness of 2 to 20 micrometers, sufficient to prevent penetration of incident charged particles through the layer to the substrate, the conductive layer having a surface; and
   at least one reference-mark element situated on the surface of the conductive layer, the reference-mark element being formed of a material that emits backscattered electrons when irradiated by incident charged particles.

2. The reference mark of claim 1, wherein the substrate is made of a glass ceramic material.

3. The reference mark of claim 1, wherein the material that emits backscattered electrons is a heavy metal.

4. The reference mark of claim 1, comprising multiple reference-mark elements arranged into a line-and-space pattern.

5. In a charged-particle-beam microlithography apparatus, a substrate stage comprising a reference mark, comprising:
   a substrate made of a low-thermal-expansion material, the substrate having a surface;
   a layer of an electrically conductive material situated on the surface of the substrate, the conductive layer being connected to electrical ground and being made of a light metal having a thickness of 2 to 20 micrometers, sufficient to prevent penetration of incident charged particles through the layer to the substrate, the conductive layers having a surface; and
   at least one reference-mark element situated on the surface of the conductive layer, the reference-mark element being formed of a material that emits backscattered electrons when irradiated by incident charged particles.

6. A charged-particle-beam microlithography apparatus, comprising a reference mark, comprising:
   a substrate made of a low-thermal-expansion material, the substrate having a surface;
   a layer of an electrically conductive material situated on the surface of the substrate, the conductive layer being connected to electrical ground and being made of a light metal having a thickness of 2 to 20 micrometers, sufficiect to prevent penetration of incident charged particles through the layer to the substrate, the conductive layer having a surface; and
   at least one reference-mark element situated on the surface of the conductive layer, the reference-mark element being formed of a material that emits backscattered electrons when irradiated by incident charged particles.

* * * * *